United States Patent
Ruda et al.

(10) Patent No.: US 10,310,183 B2
(45) Date of Patent: Jun. 4, 2019

(54) TEMPLATE-BASED EPITAXIAL GROWTH OF LATTICE MISMATCHED MATERIALS ON SILICON

(71) Applicant: Cisco Technology, Inc., San Jose, CA (US)

(72) Inventors: Harry E. Ruda, Toronto (CA); Igor Savelyev, Thornhill (CA); Marina Blumin, Vaughan (CA); Christina F. Souza, Toronto (CA)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 15/660,916

(22) Filed: Jul. 26, 2017

(65) Prior Publication Data

US 2019/0033524 A1   Jan. 31, 2019

(51) Int. Cl.
| | |
|---|---|
| G02B 6/12 | (2006.01) |
| G02B 6/122 | (2006.01) |
| H01S 5/30 | (2006.01) |
| H01S 5/02 | (2006.01) |

(52) U.S. Cl.
CPC .......... *G02B 6/1228* (2013.01); *H01S 5/021* (2013.01); *H01S 5/3013* (2013.01)

(58) Field of Classification Search
CPC ....... H01L 2924/00014; H01L 2924/00; H01L 2224/16225; G02B 6/12; G02B 6/4214
See application file for complete search history.

(56) References Cited

U.S. PATENT DOCUMENTS

| | | | | |
|---|---|---|---|---|
| 5,385,114 A | * | 1/1995 | Milstein | B82Y 20/00 117/1 |
| 2012/0326310 A1 | * | 12/2012 | Busnaina | H01L 21/2885 257/746 |

OTHER PUBLICATIONS

K. Linder, J. Phillips, O. Qasaimeh, X. Liu, S. Krishna, P. Bhattacharya, and J. Jiang, "Self-organized In0.4Ga0.6As quantum-dot lasers grown on Si substrates," Applied Physics Letters, vol. 74, No. 10, Mar. 8, 1999, 3 pages.

Z. Mi, J. Yang, P. Bhattacharya, G. Qin, and Z. Ma, "High-performance quantum dot lasers and integrated optoelectronics on Si," Proc. IEEE, 97, 1239 (2009) [Abstract Only] [Accessed Online] http://ieeexplore.ieee.org/document/5075760/.

T. Wang, H. Liu, A. Lee, F. Pozzi, and A. Seeds, "1.3 mm InAs/GaAs quantum-dot lasers monolithically grown on Si substrates," Opt. Express 19, 11381 (2011).

(Continued)

*Primary Examiner* — Jennifer Doan
(74) *Attorney, Agent, or Firm* — Patterson + Sheridan, LLP

(57) ABSTRACT

The embodiments of the present disclosure describe forming a semiconductor layer (e.g., III-V semiconductor material) on a silicon substrate using a template. In one embodiment, the template is patterned to form a plurality of cylindrical openings or pores that expose a portion of the underlying silicon substrate. The material of the semiconductor is disposed into the pores to form individual crystals or monocrystals. Because of the lattice mismatch between the crystalline silicon substrate and the material of the semiconductor layer, the monocrystals may include defects. However, the height of the pores is controlled such that these defects terminate at a sidewall of the template. Thus, the monocrystals can be used to form a single sheet (or single crystal) semiconductor layer above that template that is defect free.

10 Claims, 4 Drawing Sheets

(56) References Cited

OTHER PUBLICATIONS

A. Lee, Q. Jiang, M. Tang, A. Seeds, and H. Liu, "Continuous-wave InAs/GaAs quantum-dot laser diodes monolithically grown on Si substrate with low threshold current densities," Opt. Express 20, 22181 (2012).

S. Chen, M. Tang, J. Wu, Q. Jiang, V. Dorogan, M. Benamara, Y. Mazur, G. Salamo, A. Seeds, and H. Liu, "1.3 m InAs/GaAs quantum-dot laser monolithically grown on Si substrates operating over 100° C.," Electron. Lett. 50, 1467 (2014).

A. Y. Liu, C. Zhang, J. Norman, A. Snyder, D. Lubyshev, J. M. Fastenau, A. W. Liu, A. C. Gossard, and J. E. Bowers, "High performance continuous wave 1.3 ?m quantum dot lasers on silicon," Applied Physics Letters, vol. 104, 041104 (2014), 5 pages.

\* cited by examiner

TEMPLATE-BASED EPITAXIAL GROWTH OF LATTICE MISMATCHED MATERIALS ON SILICON

TECHNICAL FIELD

Embodiments presented in this disclosure generally relate to forming a semiconductor layer on a silicon substrate using a template.

BACKGROUND

Silicon-on-Insulator (SOI) optical devices may include an active surface layer that includes waveguides, optical modulators, detectors, CMOS circuitry, metal leads for interfacing with external semiconductor chips, and the like. Although crystalline silicon is excellent at forming waveguides with submicron dimensions, silicon is a poor material for both generating and absorbing light at wavelengths used for digital communication. While III-V semiconductors are better suitable for forming optical sources, these materials have a lattice constant that is much different than crystalline silicon which means these semiconductors cannot be directly grown on silicon using typical CMOS fabrication techniques without defects.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DESCRIPTION OF EXAMPLE EMBODIMENTS

Overview

Figure 1:
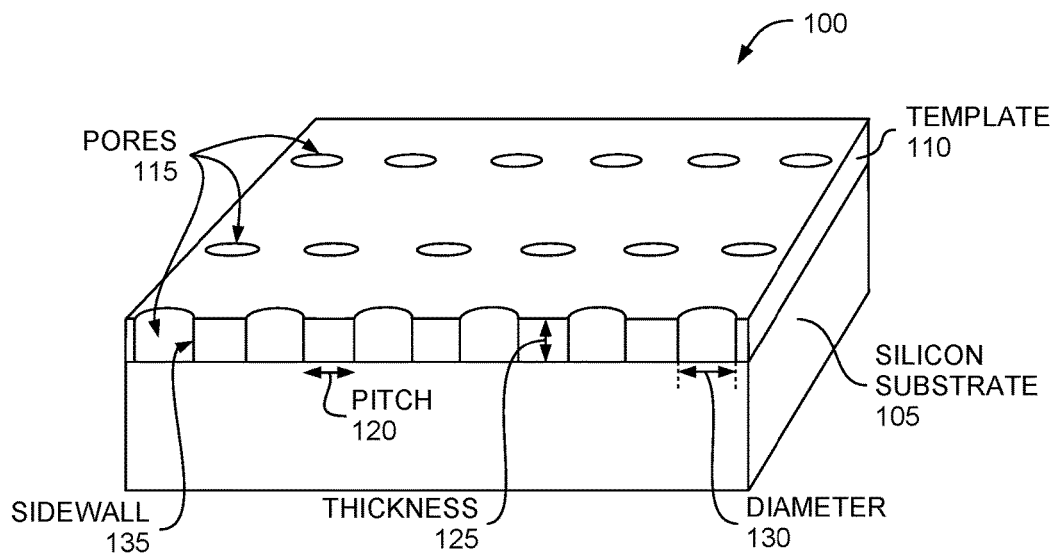
FIG. 1 illustrates a photonic device that includes a template for forming monocrystals for a semiconductor, according to one embodiment disclosed herein.

One embodiment presented in this disclosure is a photonic device that includes a crystalline silicon substrate and a template including an inert material disposed on the silicon substrate where the template comprises a plurality of pores that extend from a top surface of the template to the silicon substrate. Moreover, a respective monocrystal of a semiconductor material is disposed in each of the plurality of pores and the semiconductor material has a different lattice constant than the silicon substrate. The photonic device also includes a semiconductor layer disposed on the top surface and epitaxially disposed on the respective monocrystals to form a single crystalline layer.

Another embodiment presented in this disclosure is a method of forming a photonic device. The method includes forming a template comprising an inert material on a crystalline silicon substrate where the template comprises a plurality of pores that extends from a top surface of the template to the silicon substrate. The method includes depositing a semiconductor material to form a respective monocrystal in each of the plurality of pores where the semiconductor material has a different lattice constant than the silicon substrate and forming a semiconductor layer on the top surface, wherein the semiconductor layer is epitaxially disposed on the respective monocrystals to form a single crystalline layer.

Another embodiment presented in this disclosure is a photonic device that includes a crystalline semiconductor substrate formed from a first semiconductor material and a template comprising an inert material disposed on the semiconductor substrate where the template comprises a plurality of pores that extends from a top surface of the template to the semiconductor substrate. Moreover, a respective monocrystal of a second semiconductor material is disposed in each of the plurality of pores, and the second semiconductor material has a different lattice constant than the first semiconductor material. The photonic device a semiconductor layer epitaxially disposed on the respective monocrystals to form a single crystalline layer.

Example Embodiments

The embodiments of the present disclosure describe forming a semiconductor layer on a silicon substrate using a template. For example, the semiconductor layer can be a III-V semiconductor material which can then be used to form an optical source. If the semiconductor layer were grown directly on the silicon substrate, the lattice mismatch between silicon the III-V semiconductor can cause defects in the semiconductor layer which prevents the layer from being monocrystalline—i.e., a single crystal. Such defects can severely limit the ability of III-V materials to emit light and render it impractical for forming a light source.

In one embodiment, the template is an inert, insulative material (e.g., silicon dioxide, silicon nitride, hafnium oxide, and the like). The inert material can be patterned to form a plurality of cylindrical openings or pores that expose a portion of the underlying silicon substrate. The material of the III-V semiconductor is disposed into the pores to form individual single crystals or monocrystals. Because of the lattice mismatch between the silicon and the III-V semiconductor, the monocrystals (i.e., the material nucleated in the pores) may include defects. However, the height of the pores is controlled such that the defects terminate at a sidewall of the lattice. Thus, the monocrystals can be used to form a single sheet (or single crystal) III-V semiconductor layer above the template that is defect free. In this manner, a III-V semiconductor may be formed on a silicon substrate that has a different lattice constant. Using additional processing steps, the semiconductor layer can be formed into an optical source (e.g., a quantum dot or laser) which is optically coupled to a waveguide embedded in the underlying silicon substrate.

FIG. 1 illustrates photonic device 100 that includes a template 110 for forming monocrystal for a semiconductor, according to one embodiment disclosed herein. The photonic device 100 includes a silicon substrate 105 on which the template 110 is disposed. The template 110 includes multiple pores 115 which are defined by sidewalls 135 in the template 110. Although shown as being cylindrical apertures, the pores 115 can be any shape—e.g., rectangular, elliptical, etc.

In one embodiment, a diameter 130 of the pores 115 is controlled such that a monocrystal is grown in each one of the pores 115. For example, gallium and arsenic atoms can be deposited onto the template 110 and fall into the pores 115 where the atoms form into a single crystal of gallium arsenide. Because of the lattice mismatch between gallium arsenide (a III-V semiconductor) and the silicon substrate 105, the crystalline material in the pores 115 may include defects such as dislocations. If these defects extend out of the pores 115, the defects cause a gallium arsenide layer above the template 110 to be polycrystalline rather than monocrystalline or a single crystal. However, in one embodiment, the diameter 130 and a thickness or the pores 115 is set such that these defects terminate at the sidewalls 135. Thus, after the pores 115 are filled, the crystalline monocrystals can be used to grow a single crystalline semiconductor layer that in both the lateral and vertical directions.

In addition to controlling the diameter 130 and the thickness 125 of the template 110, a pitch 120 between the center of neighboring or adjacent pores 115 can be controlled. In one embodiment, a ratio between the pitch 120 and the diameter 130 is set to ensure that the semiconductor layer can be grown laterally and vertically above the template 110 once the pores 115 are full. In one embodiment, the diameter 130 ranges from 15 nanometers to 100 nanometers, and in another embodiment, from 20 nanometers to 60 nanometers. In one embodiment, the pitch 120 is between 40 nanometers to 100 nanometers, and in another embodiment, from 50 nanometers to 70 nanometers. In one embodiment, the thickness 125 is between 10 nanometers to 30 nanometers.

In FIG. 1, the pores 115 in the template 110 are arranged in rows and columns but this is not a requirement. In another embodiment, the pores 115 are aligned on diagonals to form a honeycomb type pattern where the pores 115 in one row are offset relative to the pores 115 in the adjacent rows.

Figure 2:
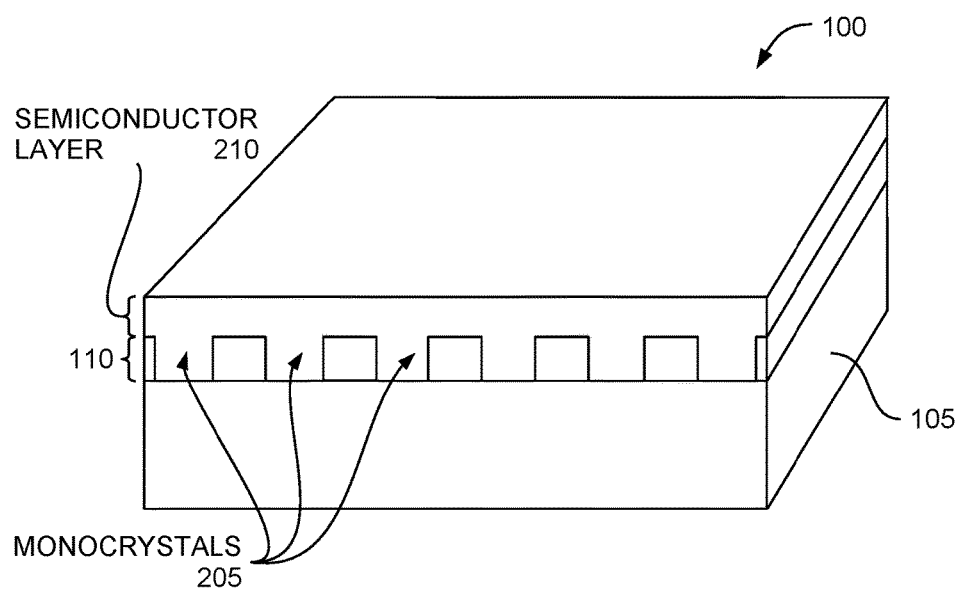
FIG. 2 illustrates a photonic device which includes a semiconductor layer formed from a plurality of monocrystals, according to one embodiment disclosed herein.

FIG. 2 illustrates the photonic device 100 which includes a semiconductor layer formed from a plurality of monocrystals 205, according to one embodiment disclosed herein. As shown, the semiconductor material is deposited in the pores to form the monocrystals 205. In one embodiment, the material in each one of the pores has the same crystal structure and orientation. Moreover, in one embodiment, at the top of the template 110, the monocrystals 205 have the same orientation (assuming any defects in the monocrystals 205 have terminated at a sidewall of the template 110). As such, the semiconductor layer 210 may include single crystalline semiconductor material that is epitaxially disposed on (e.g., continuous) the monocrystals 205.

In one embodiment, the semiconductor layer 210 is a different semiconductor material than the silicon substrate 105. In one embodiment, the semiconductor layer 210 is a III-V semiconductor. Although gallium arsenide is referred to explicitly herein, the embodiments are not limited to such. The general template structure shown in FIGS. 1 and 2 can be adapted (e.g., the pitch, thickness, and diameter can be controlled) to permit the growth of other III-V semiconductors directly on the silicon substrate 105 (e.g., indium gallium arsenide, nitride materials, phosphoric materials, and the like). Moreover, although a silicon substrate 105 is disclosed herein, the embodiments are not limited to such. Instead, the template 110 can be adapted to be used between any two different semiconductors such as a different group IV semiconductor and gallium arsenide or between two different III-V semiconductors to form a defect free semiconductor layer 210 on a semiconductor substrate 105 with a different lattice constant.

In one embodiment, the semiconductor layer 210 is processed to form an optical source, but in other examples the layer 210 could be used to form an optical detector, modulator, or other optical device. In one embodiment, the template 110, the monocrystals 205, and the semiconductor layer 210 are compatible with standard CMOS processes. For example, in another embodiment, the silicon substrate 105 can be mis-cut such that the top surface has an orientation that is between the (100) plane and the (110) plane so that the top surface has a lattice constant that better matches the lattice constant of gallium arsenide to result in a non-planar substrate with many nucleation points near the crystal terraces. However, as a result, the silicon substrate 105 is not compatible with standard CMOS fabrication techniques. However, by using the template 110 as shown in FIGS. 1 and 2, the top surface of the silicon substrate 105 can be oriented on the (100) plane which is compatible with standard CMOS techniques and forms defect free gallium arsenide in the semiconductor layer 210.

Figure 3:
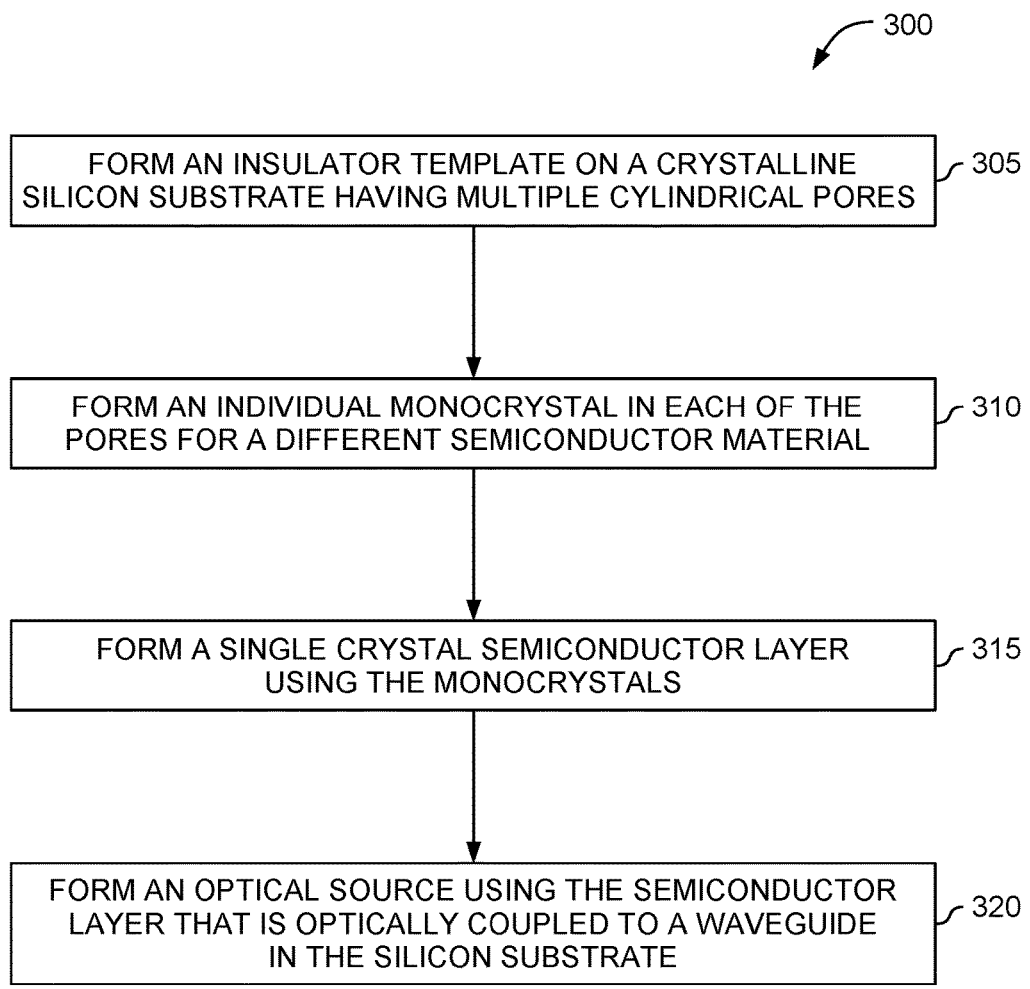
FIG. 3 is a flowchart for forming a different semiconductor on silicon, according to one embodiment disclosed herein.

FIG. 3 is a flowchart of a method 300 for forming a different semiconductor on silicon, according to one embodiment disclosed herein. At block 305, an insulator template is formed on a crystalline silicon substrate having multiple cylindrical pores. In one embodiment, the template is fabricated such that the pores have a defined thickness, diameter, and pitch as illustrated in FIG. 1. The template may be formed from any inert material which does not easily react with the semiconductor material that is deposited in later processing steps. Some non-limiting examples of suitable materials for the template include silicon dioxide, silicon nitride, silicon oxy-nitride, or hafnium oxide.

In one embodiment, the conditions used to deposit or form the template on the silicon substrate are controlled to reduce the sticking coefficient for adatoms on the template. In one embodiment, the stickiness of the semiconductor atoms is decreased to the inert template. For example, controlling the temperature when forming the template can affect the sticking coefficient of the material which determines whether semiconductor material deposited onto the template falls into the holes or sticks to the top of the template. Different types of inert material can have different sticking coefficients.

Further, the cleanliness of the silicon substrate exposed by the pores in the template can affect the growth of the monocrystals on the silicon substrate. In one embodiment, an active hydrogen treatment with lower temperatures is used to clean the pores and the underlying silicon substrate after the template has been formed.

At block 310, an individual monocrystal is formed in each of the pores for a semiconductor material that is different from the underlying semiconductor substrate. In one embodiment, molecular beam epitaxy (MBE) or metalorganic chemical vapor deposition (MOCVD) (also referred to as metalorganic vapor phase epitaxy (MOVPE)) is used to form the monocrystals in the pores of the template. The monocrystals are bonded to the silicon substrate, although this bond is loose given the lattice mismatch between the two materials.

If forming gallium arsenide monocrystals, the MBE or MOCVD process can be controlled to increase the likelihood that the gallium atoms fall into the pores rather than stick on top of the template. The MBE and MOCVD can control how much of each material (e.g., gallium and arsenic) are deposited onto the substrate. Put differently, the deposition process controls the rate at which the semiconductor material is deposited onto the template. For example, to reduce the likelihood that the semiconductor material sticks to the top of the template, the ratio of gallium and arsenic in the deposition chamber may be set to a predefined value. In one embodiment, the diffusion distance of the gallium (i.e., the average distance the gallium travels on the top of the template before stopping) can be decreased by having more arsenic atoms in the chamber than gallium atoms thereby increasing the likelihood that the gallium atoms will fall into a pore rather than sticking to the top of the template.

Figure 4:
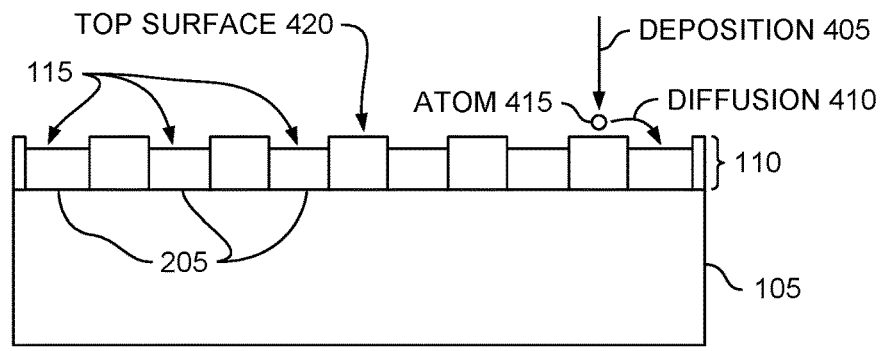
FIG. 4 illustrates forming monocrystals in the pores of a template, according to one embodiment disclosed herein.

FIG. 4 illustrates forming monocrystals 205 in the pores 115 of the template 110, according to one embodiment disclosed herein. As shown, an individual monocrystal has begun to form in each of the pores 115 when depositing the semiconductor layer during block 310 of method 300. Although some of the deposited material may fall directly into the pores 115, FIG. 4 illustrates an atom 415 which is deposited as shown by arrow 405 onto a top surface 420 of the template 110.

Because the template 110 is formed from an inert material, the atom 415 (e.g., a gallium or arsenic atom) may not initially bond to the top surface 420. Instead, the atom 415 may diffuse as shown by arrow 410 away from the location where the atom 415 fell on the top surface 420. In one embodiment, it is preferred that the atom 415 fall into one of the pores 115 rather than remaining on the top surface 420.

In one embodiment, the temperature of the silicon substrate 105 (or the temperature in the deposition chamber) is increased beyond the temperature required to form the monocrystal on top of the inert material of the template. Doing so can also increase the likelihood that semiconductor material falls into the pores 115. For example, increasing the temperature of the substrate can increase desorption where atoms 415 that initially stick to the top surface 420 of the template are 110 desorbed or can continue to move along the top surface 420 until falling into the pores 115. Stated differently, increasing the temperature can increase the diffusion distance of the atom 415 which increases the likelihood the atom 415 is captured in a pore 115.

Further, reducing the pitch between the pores 115 in the template 110 can also reduce the amount of semiconductor material that forms of the top surface 420 of the template 110 rather than falling into the pores 115. That is, by reducing the pitch, for any given diffusion distance it becomes more likely that the atom 415 falls into a pore 115 before sticking to the top surface 420.

One technique for preventing formation of metallic gallium droplets in the pores which provoke inhomogeneous growth is to increase the arsenic flux and make intermediate stops with a closed gallium source and an opened arsenic source such that arsenic continues to be deposited onto the template while the gallium is not.

Returning to method 300, at block 315 a single crystal semiconductor layer is formed using the monocrystals in the pores of the template. In one embodiment, the dimensions of the pores ensures that only one crystalline structure (e.g., only one monocrystal) is formed in each pore during block 310. Moreover, the orientation of the monocrystals may be the same or similar such that a single crystal can be grown using the monocrystals. However, the monocrystals can have one or more defects in their respective crystalline structures due to the lattice mismatch between the material of the monocrystals and the underlying crystalline silicon substrate.

Figure 5:
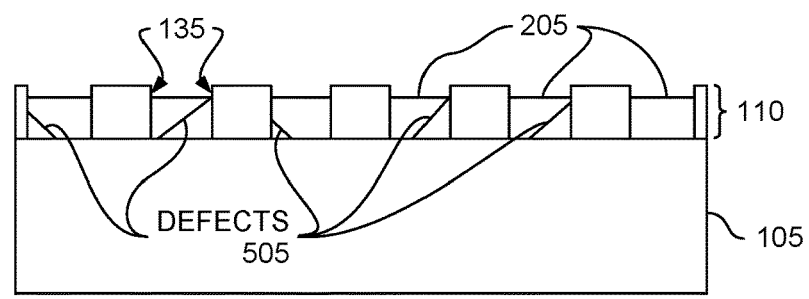
FIG. 5 illustrates defects in the monocrystals terminating at sidewalls in the template, according to one embodiment disclosed herein.

FIG. 5 illustrates defects 505 in the monocrystals 205 terminating at sidewalls 135 in the template 110, according to one embodiment disclosed herein. As shown, each monocrystal 205 has at least one defect 505. However, in other examples, one of the monocrystals 205 may not have any defects or may have multiple defects. In one embodiment, if the material of the monocrystals 205 is gallium arsenide, the defects 505 (also referred to as threading dislocations) may have the same offset angle relative to the silicon substrate 105. In one example, the defects 505 may extend along a plane that is 55 degrees relative to the substrate 105. FIG. 5 further illustrates that the defects 505 can start at different locations along the bottom of the monocrystals 205, and thus, can terminate at the sidewalls 135 at different locations.

As mentioned above, the thickness of the template 110 (i.e., the height of the sidewalls 135) can be set to ensure that any defects 505 in the monocrystals 205 terminate at a sidewall 135, and as a result, do not extend out of the pores. Thus, the height of the sidewall 135 needed to prevent the defects 505 from extending beyond the pores 115 is dependent on the diameter (or width) of the pores 115. For example, larger diameter pores means that defects 505 that start closer to where the bottom of the monocrystals 205 contact the sidewall 135 extend higher up the sidewalls 135 before terminating.

If the semiconductor layer were formed directly on the silicon substrate 105 without using the template 110, the defects 505 can continue to extend into the upper regions of the deposited semiconductor layer. For example, the defects can extend five microns or more from the silicon substrate. Although increasing the thickness of the semiconductor layer can reduce the negative impact of the defects 505, this means the optical source formed using the semiconductor material is further away from the silicon substrate which can reduce optical coupling efficiency to waveguides in or on the silicon substrate as well as reduce thermal coupling.

Figure 6:
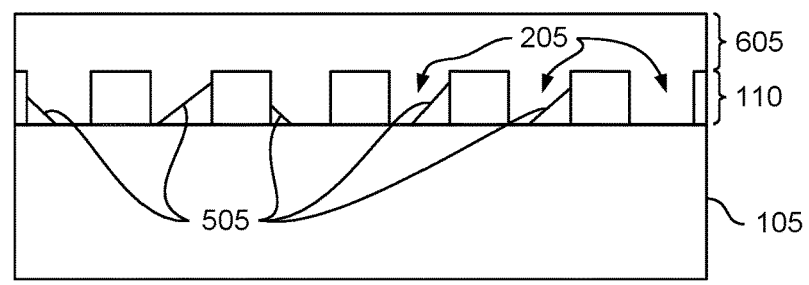
FIG. 6 illustrates a crystalline semiconductor layer without defects formed using the monocrystals, according to one embodiment disclosed herein.

FIG. 6 illustrates a crystalline semiconductor layer 605 without defects formed using the monocrystals 205, according to one embodiment disclosed herein. In one embodiment, the defects 505 terminate in the monocrystals 205 within the template 110 which results in a substantially defect free semiconductor layer 605. That is, the semiconductor layer 605 is formed from the same material as the material forming the monocrystals 205 but the defects have been removed.

Unlike examples where the semiconductor material is formed without using the template 110, in FIG. 6 the defects do not extend beyond the height of the template 110 which can range from 10 to 30 nanometers. Thus, an optical device formed using the semiconductor layer 605 can be disposed much closer to the silicon substrate 105 than a device which was formed without using the template 110 where the thickness of the semiconductor layer is increased to mitigate the negative impact caused by defects 505. As a result, the light generated by the optical device may be closer to the substrate 105 which can improve optical coupling. In addition, the thermal coupling between the optical device and the silicon substrate 105 is improved since the heat generating elements in the optical device may be disposed closer to the substrate 105. Improving the thermal coupling can improve the lifetime and performance of the optical device since heat (which can damage the optical device and limit its performance) is more efficiently radiated into the silicon substrate 105.

In one embodiment, the semiconductor layer is grown both laterally and vertically. Overgrowth (i.e., when the crystalline semiconductor material extends out of the pores) may start by the coalescence of the individual crystals nucleated in the pores. For example, some of the monocrystals 205 can begin to coalescence together to form a single crystal while other of the monocrystals 205 have not yet filled their respective pores. However, the crystal can continue to grow in a lateral direction (e.g., at the edges of the monocrystalline structure formed when a portion of the monocrystals coalesce) until all the monocrystals are connected to the same crystal. Put differently, the monocrystals 205 formed in the pores nucleate and cause the growth of a thin film above the plane of the template, which can be referred to most generally as a thin film structure. Although in FIG. 5 the semiconductor layer 605 is limited to the edges of the template 110, in other embodiments the layer 605 may extend beyond the edges of the template 110.

Returning to method 300, at block 320 an optical source is formed using the semiconductor layer that is optically coupled to a waveguide in the silicon substrate. That is, the crystalline semiconductor layer formed using the monocrystals in the pores of the template can be processed further to form an optical source which generates an optical signal. In one embodiment, one or more different semiconductor layers are deposited onto the semiconductor layer formed at block 315. For example, an indium gallium arsenide layer may be deposited onto the semiconductor layer. Moreover, the semiconductor layer or layers can be doped N-type or P-type while being deposited or after being deposited onto the photonic device.

Figure 7:
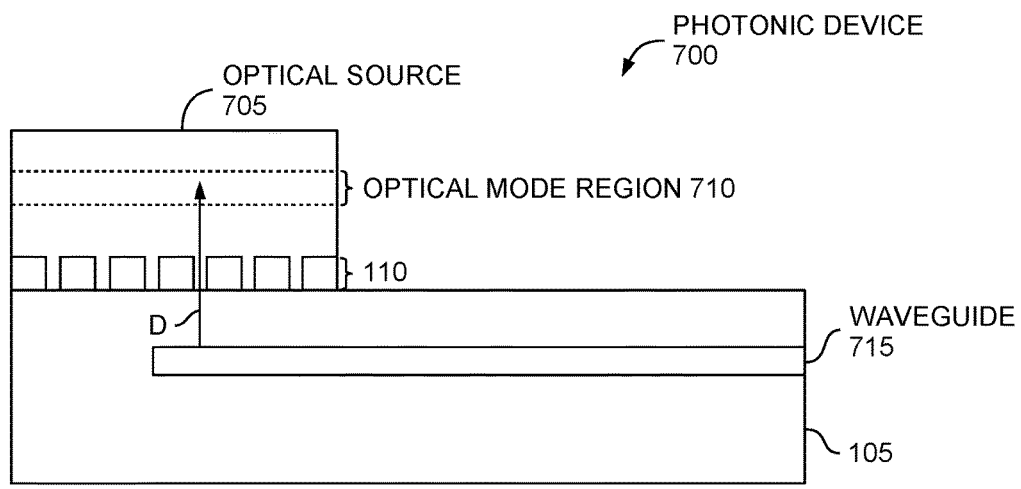
FIG. 7 illustrates an optical source optically coupled to a waveguide embedded in a silicon substrate, according to one embodiment disclosed herein.

FIG. 7 illustrates an optical source 705 optically coupled to a waveguide 715 embedded in a silicon substrate 105, according to one embodiment disclosed herein. Specifically, FIG. 7 illustrates a photonic device 700 that includes the silicon substrate 105 with the integrated optical source 705. Unlike in other optical systems where an optical source is first fabricated and then connected to the silicon substrate 105 (e.g., a photonic chip), in the photonic device 700 the optical source 705 is fabricated on the silicon substrate 105. The optical source 705 is fabricated directly on the silicon substrate 105 with the aid of the template 110.

In one embodiment, the optical source 705 is a laser (e.g., an electrically pumped laser), quantum dot, or optically pumped gain media using radiation brought up from an underlying silicon photonic device. For example, the optical source 705 may include layers of different semiconductor materials that are doped differently. For example, an indium gallium arsenide layer may be deposited between two gallium arsenide layers with opposite doping types.

The optical source 705 illustrates a region 710 which confines an optical mode of the light generated by the optical source 705. In one embodiment, the region 710 can be shaped to force the majority of the optical mode closer to the silicon substrate 105. In this embodiment, the silicon substrate 105 includes a waveguide 715 that is optically coupled to the light generated in the region 710 of the optical source 705. In one embodiment, the coupling efficiency between the optical source 705 and the waveguide 715 is improved as the distance (D) between the waveguide 715 and the center of the optical mode region 710 is reduced. That is, using the template 110 can reduce the distance (D) relative to an optical system that does not include the template 110 which improves the optical efficiency of the photonic device 700.

In one embodiment, the distance (D) between the center of the optical mode (or the light generating region) in the optical source 705 and the waveguide 715 is less than five microns. In another embodiment, this distance is less than 3 microns. In other embodiments, this distance is less than 2 microns. In addition to improving the optical coupling efficiency, the thermal coupling may be improved. For example, generating light in the region 710 may result in heat which is then dispersed by the silicon substrate 105. Increasing the thermal coupling can improve the life span of the optical source 705. Further, the optical source 705 may be able to generate greater intensity light than would otherwise be possible if the region 710 where disposed further away from the silicon substrate 105.

In one embodiment, at least one dimension of the waveguide 715 is below a micron (i.e., a sub-micron waveguide). In one embodiment, the waveguide 715 is a crystalline silicon waveguide. However, in other embodiments, the waveguide 715 is formed from silicon nitride or silicon oxy-nitride. Although not shown, a dielectric material with a different dielectric constant than the material of the waveguide 715 may be disposed on one or more sides of the waveguide 715.

The waveguide 715 may transmit the light generated by the optical source 705 to another optical component in the photonic device 700. For example, the waveguide 715 may couple to an input of an optical modulator or a phase shifter. In another example, the waveguide 715 transmits the light to an external optical component such as a fiber optical cable. In one embodiment, the photonic device 700 includes an adapter that converts the mode size of the optical signal in the waveguide 715 to better match the dimensions of the fiber optical cable.

Figure 8:
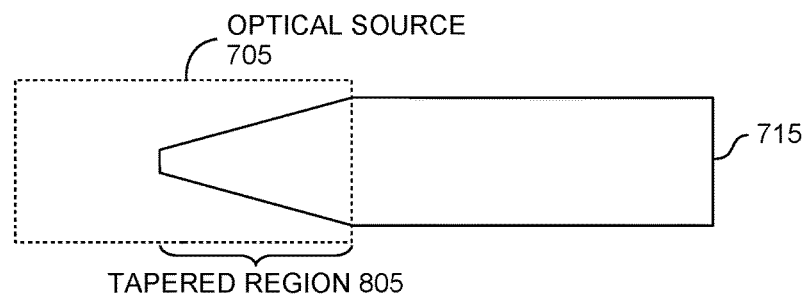
FIG. 8 illustrates a top view of the optical source 705 and the waveguide 715 illustrated in FIG. 7, according to one embodiment disclosed herein.

FIG. 8 illustrates a top view of the optical source 705 and the waveguide 715 illustrated in FIG. 7, according to one embodiment disclosed herein. For clarity, the optical source 705 is shown in ghosted lines and is transparent so that the features of the waveguide 715 can be seen. In this example, the waveguide 715 includes a tapered region 805 which is optically coupled to the optical source 705. As shown, the width of the tapered region changes along the length of the waveguide 715 which may improve the optical coupling efficiency between the optical source 705 and the waveguide 715. The tapered region 805 can taper continuously as shown or can taper using discrete steps.

In view of the foregoing, the scope of the present disclosure is determined by the claims that follow.

We claim:
1. A photonic device, comprising:
a crystalline silicon substrate;
a template comprising an inert material disposed on the silicon substrate, wherein the template comprises a plurality of pores that extends from a top surface of the template to the silicon substrate, wherein a respective monocrystal of a semiconductor material is disposed in each of the plurality of pores, and wherein the semiconductor material has a different lattice constant than the silicon substrate; and a semiconductor layer disposed on the top surface, wherein the semiconductor layer is epitaxially disposed on the respective monocrystals to form a single crystalline layer.

2. The photonic device of claim 1, wherein each of the plurality of pores contains only one monocrystal.

3. The photonic device of claim 1, wherein at least one of the respective monocrystal contains a defect resulting from lattice mismatch, wherein the defect extends at an offset angle relative to a surface of the silicon substrate on which the template is disposed.

4. The photonic device of claim 3, wherein the defect terminates at a sidewall of one of the plurality of pores, wherein the sidewall is perpendicular to the surface of the silicon substrate.

5. The photonic device of claim 4, wherein a height of the sidewall is between 10 nanometers and 30 nanometers.

6. The photonic device of claim 1, wherein a diameter of the plurality of pores is less than 100 nanometers.

7. The photonic device of claim 6, wherein the diameter of the plurality of pores is greater than 15 nanometers.

8. The photonic device of claim 1, wherein a pitch between the plurality of pores is less than 100 nanometers.

9. The photonic device of claim 1, further comprising:
at least one of an optical source or gain media comprising an optical mode region configured to output light, wherein the optical source comprises the semiconductor layer, and wherein the semiconductor layer is a III-V semiconductor.

10. The photonic device of claim 9, further comprising:
a waveguide disposed in the silicon substrate, wherein the waveguide is optically coupled to the optical source, wherein a distance between the waveguide and the optical mode region is less than three microns.

* * * * *